United States Patent
Byun et al.

(12)

(10) Patent No.: US 8,236,682 B2
(45) Date of Patent: Aug. 7, 2012

(54) METHOD OF FORMING CONTACT STRUCTURE

(75) Inventors: Kyung-Rae Byun, Suwon-si (KR); Suk-Ho Joo, Seoul (KR); Min-Joon Park, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 312 days.

(21) Appl. No.: 12/750,157

(22) Filed: Mar. 30, 2010

(65) Prior Publication Data

US 2010/0255674 A1 Oct. 7, 2010

(30) Foreign Application Priority Data

Apr. 1, 2009 (KR) .................. 10-2009-0028198

(51) Int. Cl.
*H01L 21/4763* (2006.01)
(52) U.S. Cl. ........ 438/626; 438/629; 438/648; 438/674; 977/742; 977/936; 257/E21.585; 257/E21.586
(58) Field of Classification Search .................. 438/626, 438/648, 629, 674; 977/742, 936; 257/E21.585, 257/E21.586
See application file for complete search history.

(56) References Cited

U.S. PATENT DOCUMENTS

| 7,060,543 | B2 * | 6/2006 | Choi et al. | 438/151 |
| 7,473,633 | B2 * | 1/2009 | Furukawa et al. | 438/622 |
| 2008/0182408 | A1 * | 7/2008 | Lee et al. | 438/675 |
| 2010/0264544 | A1 * | 10/2010 | Heo et al. | 257/768 |

FOREIGN PATENT DOCUMENTS

| JP | 2005-285821 | 10/2005 |
| JP | 2006-108210 | 4/2006 |
| KR | 100791948 | 12/2007 |
| KR | 1020080032518 | 4/2008 |

* cited by examiner

*Primary Examiner* — Michael Trinh
(74) *Attorney, Agent, or Firm* — F. Chau & Associates, LLC

(57) ABSTRACT

Provided is a method of forming a contact structure. The method includes forming a conductive pattern on a substrate. An interlayer insulating layer covering the conductive pattern is formed. The interlayer insulating layer is patterned to form an opening partially exposing the conductive pattern. An oxide layer is formed on substantially the entire surface of the substrate on which the opening is formed. A reduction process is performed to reduce the oxide layer. Here, the oxide layer on a bottom region of the opening is reduced to a catalyst layer, and the oxide layer on a region other than the bottom region of the opening is reduced to a non-catalyst layer. A nano material is grown from the catalyst layer, so that a contact plug is formed in the opening.

20 Claims, 5 Drawing Sheets

METHOD OF FORMING CONTACT STRUCTURE

CROSS-REFERENCE TO RELATED APPLICATION

This application claims priority under 35 U.S.C. §119 to Korean Patent Application No. 10-2009-0028198, filed on Apr. 1, 2009, the disclosure of which is hereby incorporated herein by reference in its entirety.

BACKGROUND

1. Technical Field

Example embodiments relate to a method of forming a contact structure, and more specifically, to a method of forming a contact structure using a nano material.

2. Description of Related Art

As a semiconductor device is highly integrated, the importance of Bawling a contact structure is on the rise.

However, there are difficulties which have been encountered with contact structures of conventional semiconductor devices in connection with their electrical characteristics and their reliability and stability.

Accordingly, there is a need in the art for a contact structure for a semiconductor device which has improved electrical characteristics, reliability and stability in comparison to contact structures of the conventional art.

SUMMARY

Example embodiments may provide a method of forming a contact structure which has beneficial electrical characteristics and which is stable and reliable.

In accordance with an example embodiment, a method of forming a contact structure is provided. The method includes forming a conductive pattern on a substrate. An interlayer insulating layer covering the conductive pattern is formed. The interlayer insulating layer is patterned to form an opening partially exposing the conductive pattern. An oxide layer is formed on substantially the entire surface of the substrate on which the opening is formed. A reduction process is performed to reduce the oxide layer. Here, the oxide layer on a bottom region of the opening is reduced to a catalyst layer, and the oxide layer on a region other than the bottom region of the opening is reduced to a non-catalyst layer. A nano material is grown from the catalyst layer, so that a contact plug is formed in the opening.

The oxide layer may include at least one of nickel oxide (NiO), cobalt oxide (CoO), palladium oxide (PdO), iron oxide (FeO), nickel-iron oxide (NiFeO), cobalt-iron oxide (CoFeO) and nickel-cobalt-iron oxide (NiCoFeO).

The reduction process may be performed under a process atmosphere containing hydrogen gas.

The nano material may include conductive carbon nano tubes.

The non-catalyst layer may be formed on a sidewall of the opening and on a top surface of the interlayer insulating layer.

The method may further include removing the non-catalyst layer disposed on the top surface of the interlayer insulating layer before forming the contact plug. Alternatively, the method may further include removing the non-catalyst layer disposed on the top surface of the interlayer insulating layer after forming the contact plug.

The method may further include removing the oxide layer disposed on the top surface of the interlayer insulating layer such that the oxide layer remains on the bottom region and sidewall of the opening before reducing the oxide layer.

The conductive pattern may include at least one of a titanium (Ti) layer, a tantalum (Ta) layer, a tantalum nitride (TaN) layer and a titanium nitride (TiN) layer.

The conductive pattern may include a lower pattern and an upper pattern, which are sequentially stacked. The upper pattern may include at least one of a titanium (Ti) layer, a tantalum (Ta) layer, a tantalum nitride (TaN) layer and a titanium nitride (TiN) layer.

In accordance with another example, a method of forming a contact structure is provided. The method includes preparing a semiconductor substrate, forming a lower insulating layer on the semiconductor substrate, forming a conductive pattern disposed on or surrounded by the lower insulating layer, wherein the conductive pattern includes a lower pattern and an upper pattern which are sequentially stacked. The method further includes forming an interlayer insulating layer on the semiconductor substrate having the conductive pattern, patterning the interlayer insulating layer to foam an opening partially exposing the conductive pattern, forming an oxide layer on substantially the entire surface of the semiconductor substrate on which the opening is formed, performing a reduction process to reduce the oxide layer, wherein the oxide layer on a bottom region of the opening is reduced to a catalyst layer, and the oxide layer on a region other than the bottom region of the opening is reduced to a non-catalyst layer. In addition, the method further includes growing a nano material from the catalyst layer to form a contact plug in the opening, wherein the nano material includes conductive carbon nano tubes and forming a conductive upper interconnection on the interlayer insulating layer to thereby cover the contact plug.

BRIEF DESCRIPTION OF THE DRAWINGS

Example embodiments may be understood in further detail below from the following description taken in conjunction with the accompanying drawings. It should be understood that various aspects of the drawings may have been exaggerated for clarity.

DETAILED DESCRIPTION OF THE EXAMPLE EMBODIMENTS

Figure 1A:
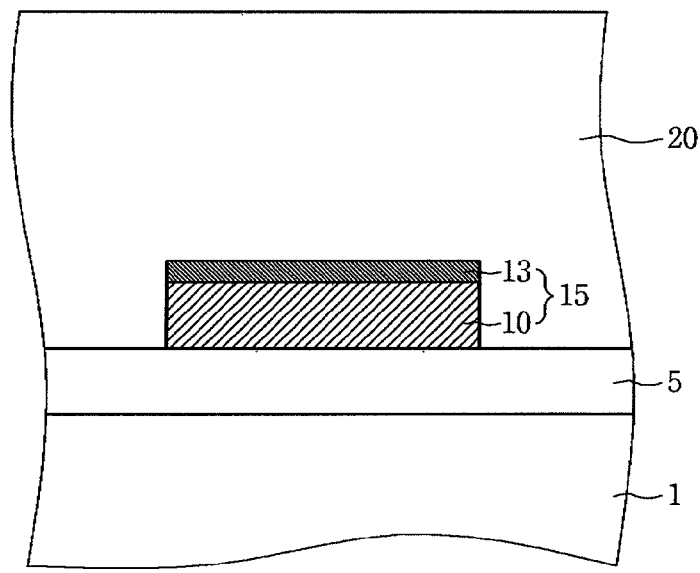
FIGS. 1A to 1F are cross-sectional views illustrating a method of forming a contact structure according to an example embodiment.

Various example embodiments will now be described more fully with reference to the accompanying drawings in which some example embodiments are shown. This inventive concept may, however, be embodied in different forms and should not be construed as limited to the embodiments set forth herein. In the drawings, the thickness of layers and regions may be exaggerated for clarity. Also, when it is referred that a layer is "on" another layer or a substrate, it may be directly formed on another layer or the substrate or a third layer may be interposed therebetween. Like reference numerals designate like elements throughout the specification.

Figure 1B:
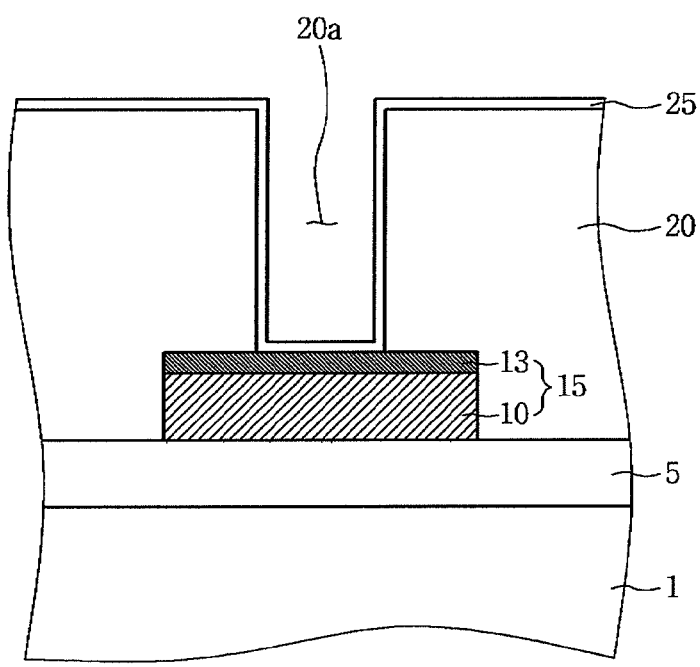
Figure 1C:
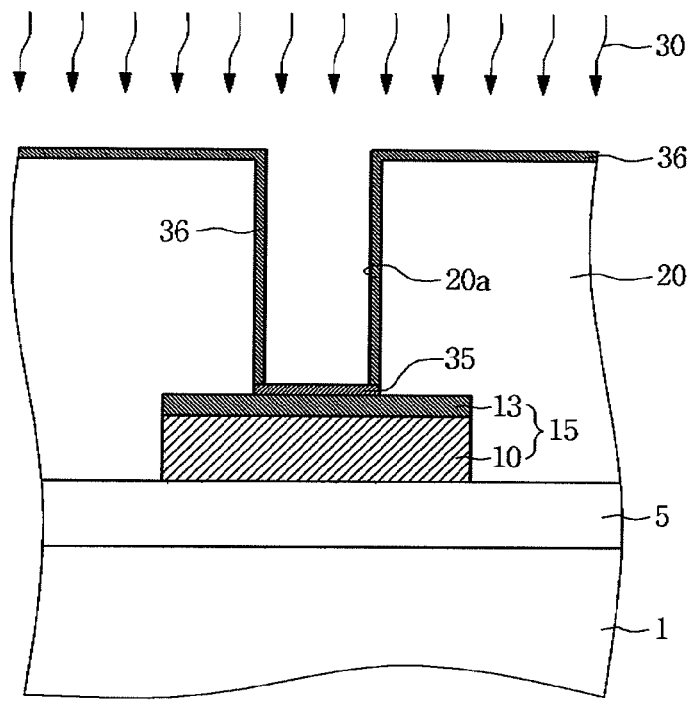
Figure 1D:
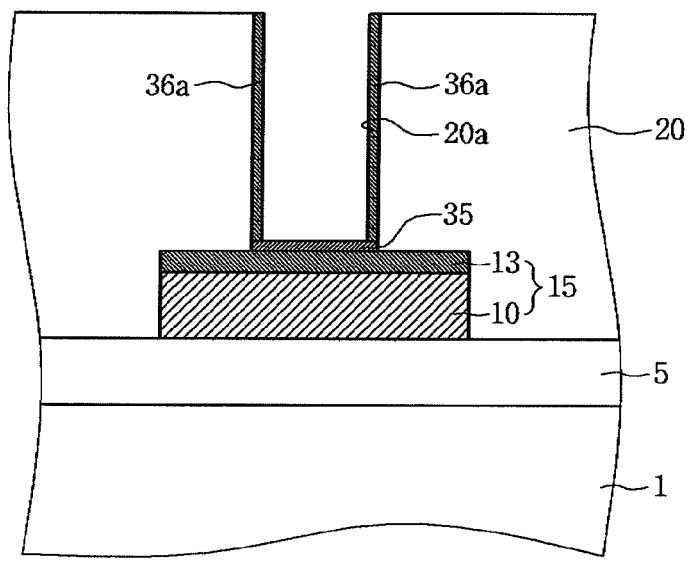
Figure 1E:
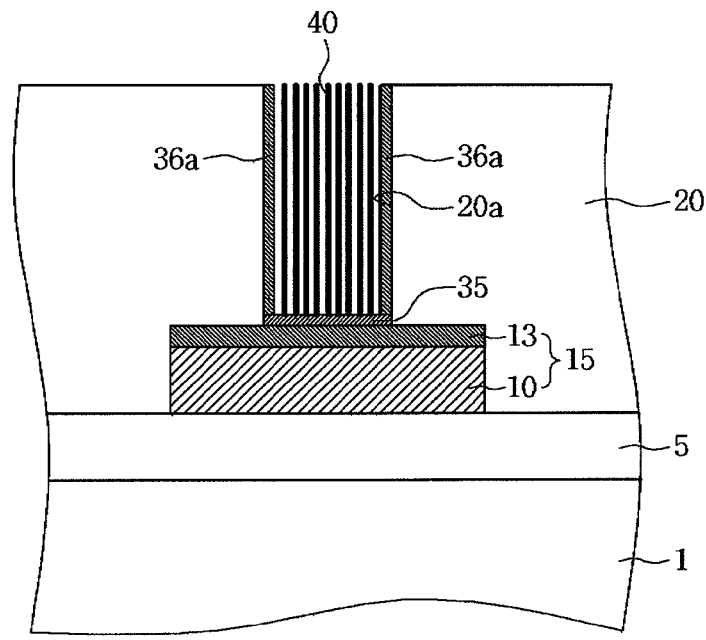
Figure 1F:
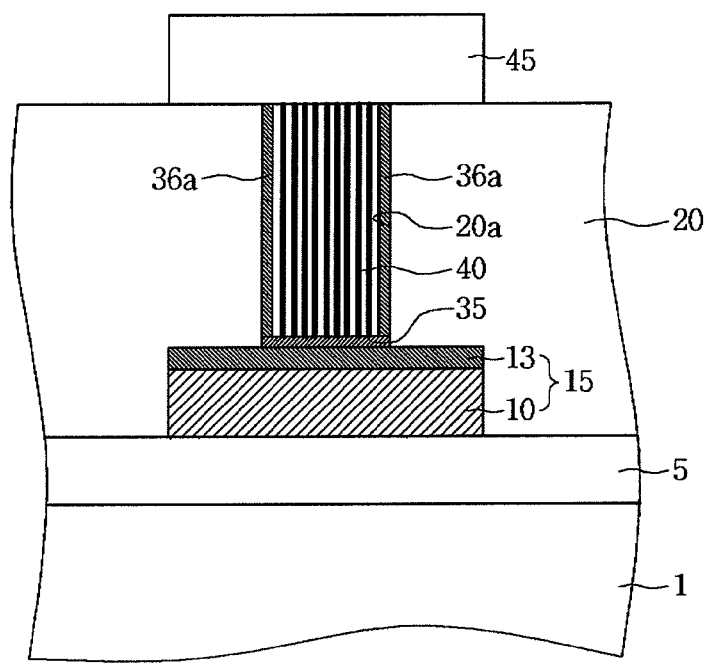
Figure 2A:
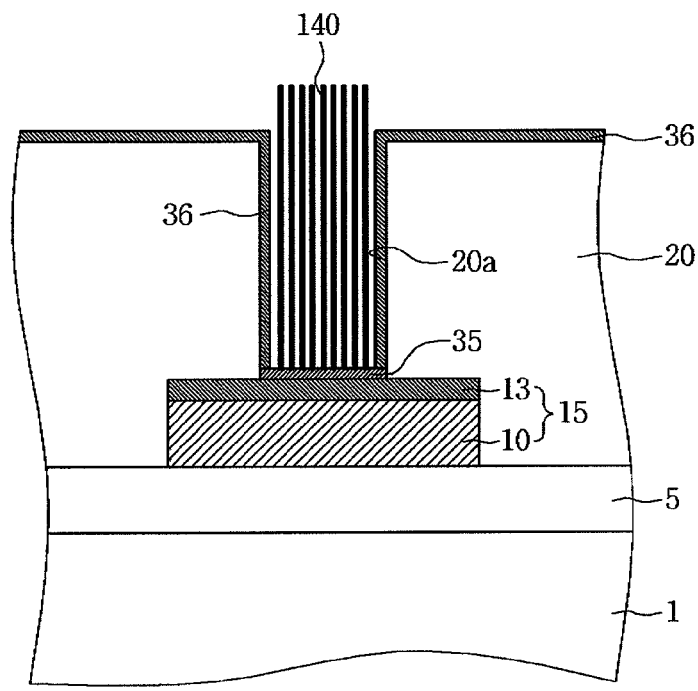
FIGS. 2A and 2B are cross-sectional views illustrating a method of forming a contact structure according to an example embodiment.
Figure 2B:
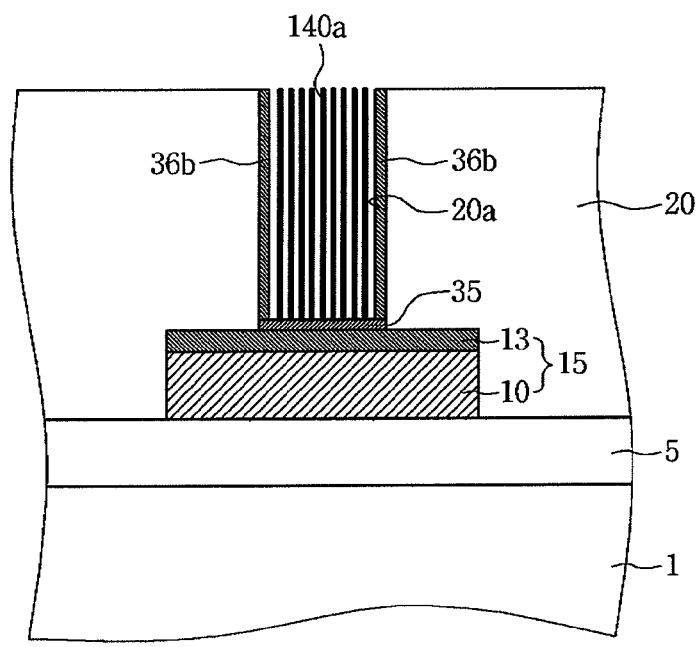
Figure 3A:
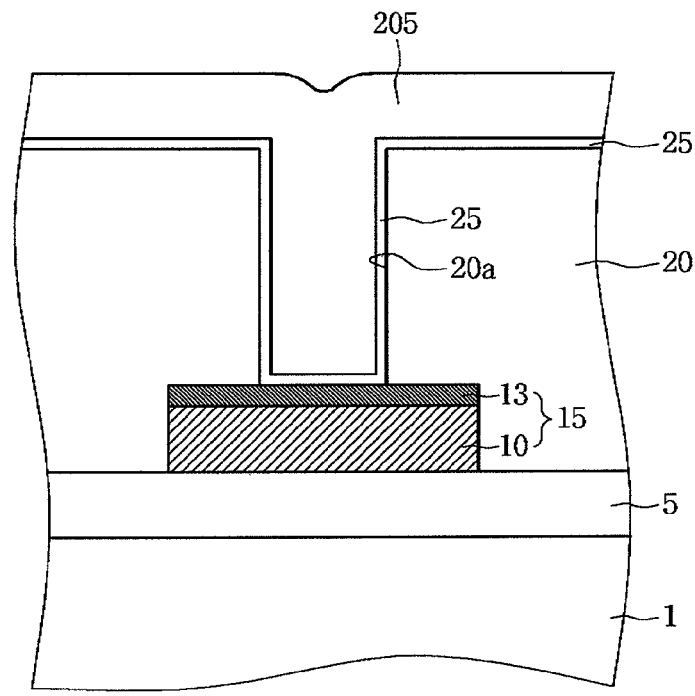
FIGS. 3A and 3B are cross-sectional views illustrating a method of forming a contact structure according to an example embodiment.
Figure 3B:
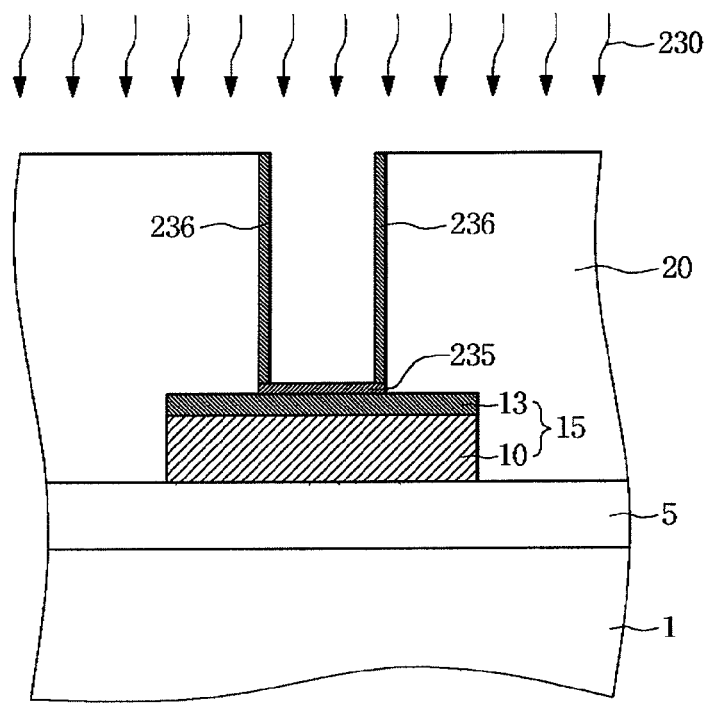

FIGS. 1A to 1F are cross-sectional views illustrating a method of forming a contact structure according to one example embodiment, FIGS. 2A and 2B are cross-sectional views illustrating a method of forming a contact structure according to another example embodiment, and FIGS. 3A and 3B are cross-sectional views illustrating a method of forming a contact structure according to still another example embodiment.

Referring to FIG. 1A, a substrate 1 may be prepared. The substrate 1 may be a semiconductor substrate. For example, the substrate 1 may be a semiconductor substrate where discrete devices such as a transistor and/or a resistor are formed. A lower insulating layer 5 may be formed on the substrate 1. A conductive pattern 15 may be formed on the lower insulating layer 5. The conductive pattern 15 may be formed of at least one of, for example, a titanium (Ti) layer, a tantalum (Ta) layer, a tantalum nitride (TaN) layer and a titanium nitride (TiN) layer. The conductive pattern 15 may be, for example, an interconnection or a contact pad constituting an integrated circuit.

The conductive pattern 15 may be formed of a conductive material or a plurality of conductive materials. For example, the conductive pattern 15 may include a lower pattern 10 and an upper pattern 13, which are sequentially stacked. The lower pattern 10 may be formed of a conductive material such as, for example, doped silicon, tungsten, copper, aluminum and molybdenum. The upper pattern 13 may include at least one of, for example, a Ti layer, a Ta layer, a TaN layer and a TiN layer.

In the present example embodiment, while it is illustrated that the conductive pattern 15 is disposed on the lower insulating layer 5, it is not limited thereto. For example, the conductive pattern 15 may be formed by a damascene process such that a sidewall of the conductive pattern 15 is surrounded by the lower insulating layer 5.

An interlayer insulating layer 20 may be formed on the substrate having the conductive pattern 15. The interlayer insulating layer 20 may be formed of, for example, a silicon oxide layer and/or a low-k dielectric layer. The low-k dielectric layer may be, for example, a silicon oxide layer containing carbon, fluorine or hydrogen, e.g., a SiOC layer, a SiOCH layer, a fluoro-silses-quioxane layer (FSQ layer), a hydro-silses-quioxane layer (HSQ layer) or a methyl-silses-quioxane layer (MSQ layer).

Referring to FIG. 1B, the interlayer insulating layer 20 may be patterned to form an opening 20a partially exposing the conductive pattern 15. An oxide layer 25 may be formed on the substrate on which the opening 20a is formed. The oxide layer 25 may include at least one material of, for example, nickel oxide (NiO), cobalt oxide (CoO), palladium oxide (PdO), iron oxide (FeO), nickel-iron oxide (NiFeO), cobalt-iron oxide (CoFeO) and nickel-cobalt-iron oxide (NiCoFeO). The oxide layer 25 may be formed to have a substantially uniform thickness. The oxide layer 25 may be formed on a bottom region of the opening 20a, a sidewall of the opening 20a and a top surface of the interlayer insulating layer 20. The oxide layer 25 may be formed to a thickness of, for example, about 10 Å to about 100 Å. For example, the oxide layer 25 may be formed to a thickness of about 20 Å to about 30 Å.

Referring to 1C, a reduction process 30 for reducing the oxide layer 25 may be performed. For example, the reduction process 30 may be performed by disposing the substrate on which the oxide layer 25 is formed in a process chamber, raising a temperature in the process chamber up to about 500° C. to about 800° C., and supplying a reducing gas on the oxide layer 25. The reducing gas may contain, for example, hydrogen gas. For example, when the reduction process 30 is performed on a nickel oxide layer formed of nickel oxide (NiOx), it may react with hydrogen gas, to which hydrogen of the nickel oxide is supplied as a reducing gas, so that vapor ($H_2O$) is formed and removed to reduce the nickel oxide to nickel. That is, the nickel oxide layer may be formed of a nickel layer.

In the present example embodiment, characteristics of layers 35 and 36, to which the oxide layer (25 of FIG. 1B) is reduced by the reduction process 30, may be determined depending on kinds of layers 15 and 20 in contact with the oxide layer (25 of FIG. 1B). For example, the oxide layer (25 of FIG. 1B) disposed on the bottom region of the opening 20a may be reduced to a catalyst layer 35 capable of growing a nano material by the reduction process 30. Further, the oxide layer (25 of FIG. 1B) disposed on a region other than the bottom region of the opening 20a may be reduced to a non-catalyst layer 36 that cannot function as a catalyst growing a nano material. The nano material may be, for example, conductive carbon nano tubes. The region other than the bottom region of the opening 20a may be a sidewall of the opening 20a and a top surface of the interlayer insulating layer 20.

When the oxide layer (25 of FIG. 1B) is formed of a nickel oxide layer, even though the nickel oxide layer is reduced to a nickel layer by the reduction process 30, characteristics of the nickel layer may be changed depending on characteristics of layers in contact with the nickel layer. For example, a nickel layer in contact with the conductive pattern 15 may be formed of a catalyst layer 35 capable of growing a carbon nano tube, and a nickel layer in contact with the interlayer insulating layer 20 may be formed of a non-catalyst layer 36 that cannot function as a catalyst growing a carbon nano tube.

Referring to FIG. 1D, a planarization process may be performed on the substrate having the catalyst layer 35 and the non-catalyst layer 36, so that the non-catalyst layer disposed on the interlayer insulating layer 20 can be removed. Therefore, the non-catalyst layer (36 of FIG. 1C) may remain on the sidewall of the opening 20a to be formed as a non-catalyst pattern 36a.

The planarization process may be performed using, for example, an etch-back and/or chemical mechanical polishing (CMP) process. For example, a sacrificial layer filling the opening 20a may be formed on the substrate having the non-catalyst pattern 36a, a CMP process may be performed until the interlayer insulating layer 20 is exposed, and the sacrificial layer may be removed. The sacrificial layer may be formed of a material that can remove the catalyst layer 35 without causing damage to the catalyst layer 35. For example, the sacrificial layer may be formed of a polymer material layer containing carbon.

Referring to FIG. 1E, a nano material may be grown from the catalyst layer 35 to form a contact plug 40. The nano material may be formed of, for example, a carbon nano tube. While the nano material is grown from the catalyst layer 35, it is not grown from the non-catalyst pattern 36a. Therefore, as the nano material is not grown from the non-catalyst pattern 36a formed on the sidewall of the opening 20a, and is grown from the catalyst layer 35 on the bottom region of the opening 20a, the nano material may be uniformly grown. That is, as the nano material, e.g., carbon nano tubes are grown from the catalyst layer 35, the carbon nano tubes constituting the contact plug 40 may be regularly arranged in the opening 20a. Meanwhile, process conditions such as, for example, a process time and/or a process gas for growing the carbon nano tubes may be adjusted, so that the carbon nano tubes may be formed to a height substantially the same as or close to the top surface of the interlayer insulating layer 20.

Referring to FIG. 1F, a conductive upper interconnection 45 covering the contact plug 40 may be formed on the interlayer insulating layer 20. Therefore, the contact plug 40 electrically connecting the upper interconnection 45 to the conductive pattern 15 may be formed of, for example, carbon nano tubes exhibiting beneficial electrical characteristics to be stable and reliable.

The example embodiment may be embodied in different forms and should not be construed as limited to the embodiments set forth above. Specific example embodiments embodied in other forms in the above example embodiment will be described with reference to FIGS. 2A, 2B, 3A and 3B.

First, the method described with reference to FIGS. 1D and 1F of the method of forming a contact structure described with reference to FIGS. 1A to 1E may be embodied in the form described with reference to FIGS. 2A and 2B. For example, referring to FIG. 2A, the same method as described with reference to FIGS. 1A to 1C may be performed, so that a substrate having the catalyst layer 35 and the non-catalyst layer 36 may be prepared. A process capable of growing the catalyst layer 35 may be performed on the prepared substrate, so that a contact plug 140 may be formed. The nano material may be formed of, for example, carbon nano tubes. As described with reference to FIG. 1E, while the nano material is grown from the catalyst layer 35, it is not grown from the non-catalyst pattern 36a. It is described with reference to FIG. 1E that the nano material, e.g., process conditions such as a process time and/or a process gas for growing carbon nano tubes 140 may be adjusted, so that the carbon nano tubes can be formed to a height substantially the same as or close to a top surface of the interlayer insulating layer 20. However, it is not limited thereto, and as illustrated in FIG. 2A, the carbon nano tubes 140 may be formed to protrude to a higher level than the top surface of the interlayer insulating layer 20 from the opening 20a.

Referring to FIG. 2B, a planarization process may be performed on the substrate having the carbon nano tubes 140 until the top surface of the interlayer insulating layer 20 is exposed. As a result, the non-catalyst layer 36 disposed on the interlayer insulating layer 20 may be removed by the planarization process to form a non-catalyst pattern 36b remaining on the sidewall of the opening 20a. The planarization process may be performed using, for example, etching back and/or CMP.

Meanwhile, the protruding portion of the carbon nano tubes 140 may be removed by the planarization process, so that the carbon nano tubes 140 can be defined within the opening 20a. Here, the carbon nano tubes foamed within the opening 20a may be defined as a contact plug 140a. Afterwards, an upper interconnection as described with reference to FIG. 1F may be formed on the contact plug 140a.

Then, the method described with reference to FIGS. 1C and 1D of the method of forming a contact structure described with reference to FIGS. 1A to 1E may be embodied to have the same configuration as FIGS. 3A and 3B. For example, referring to FIG. 3A, the same method as described with reference to FIGS. 1A and 1B may be performed, so that a substrate 1, on which the oxide layer 25 of FIG. 1B is formed, may be prepared.

A sacrificial layer 205 filling the opening 20a may be formed on the oxide layer 25. The sacrificial layer 205 may be formed of a material capable of removing the oxide layer 25 without causing damage to the oxide layer 25. For example, the sacrificial layer 205 may be formed of a photoresist layer of a polymer material containing carbon.

Referring to FIG. 3B, in the substrate having the sacrificial layer 205, the sacrificial layer 205 may be planarized until a top surface of the interlayer insulating layer 20 is exposed, so that the sacrificial layer (205 of FIG. 3A) remaining in the opening 20a can be removed. The planarization may be performed using, for example, etching back and/or CMP. While the sacrificial layer 205 is planarized, the oxide layer disposed on the top surface of the interlayer insulating layer 20 may be removed. As a result, the oxide layer (25 of FIG. 3A) may remain on the sidewall and bottom region of the opening 20a.

A reduction process 230 may be performed on the substrate having the remaining oxide layer as illustrated in FIG. 1C. As a result, the remaining oxide layer disposed on the bottom region of the opening 20a may be reduced to a catalyst layer 235 capable of growing a nano material such as, for example, a carbon nano tube, and the remaining oxide layer disposed on the sidewall of the opening 20a may be reduced to a non-catalyst layer 236 that cannot function as a catalyst growing a nano material such as a carbon nano tube. Therefore, the formed results of FIG. 3B may be substantially the same as those of FIG. 1D. Therefore, the same process as described in FIGS. 1E and 1F may be performed on the formed results of FIG. 3B, so that a contact structure can be formed.

According to example embodiments, an interlayer insulating layer covering a lower interconnection may be patterned to form an opening for forming a contact. Afterwards, an oxide layer may be formed, and the oxide layer is reduced to form a catalyst layer on a bottom region of the opening, so that a non-catalyst layer can be formed on a sidewall of the opening. As described above, the catalyst layer can be selectively formed on only the bottom region of the opening, so that a nano material grown from the catalyst layer, e.g., carbon nano tubes can be regularly arranged. Also, the oxide layer reduced to the catalyst layer can be formed after forming the opening, so that damage that may be caused to the catalyst layer can be prevented. Therefore, the carbon nano tubes having beneficial electrical characteristics can be formed to be stable and reliable in the opening.

Having described the example embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of forming a contact structure, comprising:
    forming a conductive pattern on a substrate;
    forming an interlayer insulating layer covering the conductive pattern;
    patterning the interlayer insulating layer to form an opening partially exposing the conductive pattern;
    forming an oxide layer on substantially the entire surface of the substrate on which the opening is formed;
    performing a reduction process to reduce the oxide layer, wherein the oxide layer on a bottom region of the opening is reduced to a catalyst layer, and the oxide layer on a region other than the bottom region of the opening is reduced to a non-catalyst layer; and
    growing a nano material from the catalyst layer to form a contact plug in the opening.

2. The method of claim 1, wherein the oxide layer includes at least one of nickel oxide (NiO), cobalt oxide (CoO), palladium oxide (PdO), iron oxide (FeO), nickel-iron oxide (NiFeO), cobalt-iron oxide (CoFeO) and nickel-cobalt-iron oxide (NiCoFeO).

3. The method of claim 1, wherein the reduction process is performed under a process atmosphere containing hydrogen gas.

4. The method of claim 1, wherein the nano material includes conductive carbon nano tubes.

5. The method of claim 1, wherein the non-catalyst layer is formed on a sidewall of the opening and on a top surface of the interlayer insulating layer.

6. The method of claim 5, further comprising removing the non-catalyst layer disposed on the top surface of the interlayer insulating layer before forming the contact plug.

7. The method of claim 5, further comprising removing the non-catalyst layer disposed on the top surface of the interlayer insulating layer after forming the contact plug.

8. The method of claim 1, further comprising removing the oxide layer disposed on the top surface of the interlayer insulating layer such that the oxide layer remains on the bottom region and sidewall of the opening before reducing the oxide layer.

9. The method of claim 1, wherein the conductive pattern includes at least one of a titanium (Ti) layer, a tantalum (Ta) layer, a tantalum nitride (TaN) layer and a titanium nitride (TiN) layer.

10. The method of claim 1, wherein the conductive pattern includes a lower pattern and an upper pattern, which are sequentially stacked, the upper pattern including at least one of a titanium (Ti) layer, a tantalum (Ta) layer, a tantalum nitride (TaN) layer and a titanium nitride (TiN) layer.

11. A method of forming a contact structure, comprising:
preparing a semiconductor substrate;
forming a lower insulating layer on the semiconductor substrate;
forming a conductive pattern disposed on or surrounded by the lower insulating layer, wherein the conductive pattern includes a lower pattern and an upper pattern which are sequentially stacked;
forming an interlayer insulating layer on the semiconductor substrate having the conductive pattern;
patterning the interlayer insulating layer to form an opening partially exposing the conductive pattern;
forming an oxide layer on substantially the entire surface of the semiconductor substrate on which the opening is formed;
performing a reduction process to reduce the oxide layer, wherein the oxide layer on a bottom region of the opening is reduced to a catalyst layer, and the oxide layer on a region other than the bottom region of the opening is reduced to a non-catalyst layer;
growing a nano material from the catalyst layer to form a contact plug in the opening, wherein the nano material includes conductive carbon nano tubes; and
forming a conductive upper interconnection on the interlayer insulating layer to thereby cover the contact plug.

12. The method of claim 11, wherein the oxide layer includes at least one of nickel oxide (NiO), cobalt oxide (CoO), palladium oxide (PdO), iron oxide (FeO), nickel-iron oxide (NiFeO), cobalt-iron oxide (CoFeO) and nickel-cobalt-iron oxide (NiCoFeO).

13. The method of claim 12, wherein the oxide layer is formed to a thickness of about 10 Å to about 100 Å.

14. The method of claim 13, wherein the oxide layer is formed to a thickness of about 20 Å to about 30 Å.

15. The method of claim 11, wherein the reduction process is performed by disposing the substrate on which the oxide layer is formed in a process chamber, raising a temperature in the process chamber up to about 500° C. to about 800° C., and supplying a reaction gas on the oxide layer, wherein the reaction gas includes hydrogen.

16. The method of claim 12, wherein the lower pattern is formed of a conductive material selected from the group consisting of doped silicon, tungsten, copper, aluminum and molybdenum and wherein the upper pattern may includes at least one material selected from the group consisting of a (Ti) titanium layer, a (Ta) tantalum layer, a (TaN) tantalum nitride layer and a (TiN) titanium nitride layer.

17. The method of claim 11, wherein prior to growing the nano material composed of the conductive carbon nano tubes to form the contact plug, further comprising performing a planarization process on the substrate having the catalyst layer and the non-catalyst layer so that the non-catalyst layer disposed on the interlayer insulating layer is removed and wherein the non-catalyst layer remains on a sidewall of the opening.

18. The method of claim 11, wherein prior to performing the reduction process, further comprising:
filling the opening with a sacrificial layer on the oxide layer, wherein the sacrificial layer is faulted of a photoresist layer of a polymer material containing carbon; and
planarizing the sacrificial layer until a top surface of the interlayer insulating layer is exposed, removing the sacrificial layer remaining in the opening and removing the oxide layer disposed on a top surface of the interlayer insulating layer, such that the oxide layer remains on a sidewall and the bottom region of the opening.

19. The method of claim 11, wherein in the forming of the contact plug, the conductive carbon nano tubes are formed to a height substantially the same as or close to a top surface of the interlayer insulating layer.

20. The method of claim 11, wherein the forming of the contact plug comprises:
growing the carbon nano tubes such that they protrude from the opening to a higher level than a top surface of the interlayer insulating layer;
planarizing the substrate having the conductive carbon nano tubes until the top surface of the interlayer insulating layer is exposed, removing the non-catalyst layer disposed on the interlayer insulating layer to form a non-catalyst pattern remaining on a sidewall of the opening and removing the protruding portion of the conductive carbon nano tubes to define the conductive carbon nano tubes within the opening to thereby form the contact plug.

* * * * *